(12) United States Patent
Bar-Sadeh et al.

(10) Patent No.: US 6,894,383 B2
(45) Date of Patent: May 17, 2005

(54) REDUCED SUBSTRATE MICRO-ELECTRO-MECHANICAL SYSTEMS (MEMS) DEVICE AND SYSTEM FOR PRODUCING THE SAME

(75) Inventors: Eyal Bar-Sadeh, Jerusalem (IL); Alexander Talalyevsky, Jerusalem (IL); Eyal Ginsburg, Tel Aviv (IL)

(73) Assignee: Intel Corporation, Santa Clara, CA (US)

( * ) Notice: Subject to any disclaimer, the term of this patent is extended or adjusted under 35 U.S.C. 154(b) by 48 days.

(21) Appl. No.: 10/401,963

(22) Filed: Mar. 31, 2003

(65) Prior Publication Data

US 2004/0188786 A1 Sep. 30, 2004

(51) Int. Cl.$^7$ ............................................. H01L 23/12
(52) U.S. Cl. .................... 257/704; 257/415; 250/289; 429/34; 429/35
(58) Field of Search ............................ 257/704, 415; 250/289; 429/34, 35, 40; 347/50

(56) References Cited

U.S. PATENT DOCUMENTS

| | | | |
|---|---|---|---|
| 4,426,768 A | | 1/1984 | Black et al. |
| 5,164,558 A | | 11/1992 | Huff et al. |
| 6,326,682 B1 | | 12/2001 | Kurtz et al. |
| 6,612,535 B1 | * | 9/2003 | Tai et al. ........................ 251/11 |
| 6,638,654 B2 | * | 10/2003 | Jankowksi et al. ............ 429/26 |
| 2002/0043895 A1 | * | 4/2002 | Richards et al. ............ 310/328 |
| 2004/0067407 A1 | * | 4/2004 | Sompalli et al. .............. 429/40 |

FOREIGN PATENT DOCUMENTS

WO    WO 95/20754    8/1995

OTHER PUBLICATIONS

International Search Report for International Application No. PCT/US2004/007701, dated Jul. 23, 2004.

Teomim, Doron, et al. "An innovative approach to wafer–level MEMS packaging", Packaging/Assembly Solid State Technology, Jan. 2002. www.solid-state.com.

* cited by examiner

*Primary Examiner*—Minhloan Tran
*Assistant Examiner*—Tan Tran
(74) *Attorney, Agent, or Firm*—Eitan, Pearl, Latzer & Cohen Zedek, LLP

(57) ABSTRACT

Briefly, a reduced substrate Micro-Electro-Mechanical Systems (MEMS) device, for example, a low-loss Film Bulk Acoustic Resonators (FBAR) filter or a low-loss FBAR Radio Frequency filter, and a process and a system to produce the same. A reduced substrate MEMS device in accordance with embodiments of the present invention may include a membrane bonded between packaging parts. A process in accordance with embodiments of the present invention may include bonding a first packaging part to a MEMS device including a support substrate, removing the support substrate, and bonding a second packaging part to the MEMS device.

21 Claims, 3 Drawing Sheets

REDUCED SUBSTRATE MICRO-ELECTRO-MECHANICAL SYSTEMS (MEMS) DEVICE AND SYSTEM FOR PRODUCING THE SAME

BACKGROUND OF THE INVENTION

In the field of Micro-Electro-Mechanical Systems (MEMS), devices may use or include extremely small mechanical devices. For example, in current MEMS technologies, a Film Bulk Acoustic Resonator (FBAR) Radio Frequency (RF) filter includes a thin membrane and a support substrate, for example, a silicon substrate.

Certain MEMS devices, for example, FBAR filters that comply with RF communication specifications, e.g., insertion loss specifications, require minimizing loss of RF energy during operation. In such devices, RF energy may be lost due to undesired parasitic capacitance between metal conductors of the FBAR RF filter and its silicon substrate during operation of the filter. Such conductors may pass on top of the silicon substrate of the filter, and may be separated from the silicon substrate by a thin dielectric layer, for example, epoxy glue or a similar polymer. The undesired parasitic capacitance, which may be caused by the relatively high conductivity of both the metal and the silicon, is often a significant contributor to the overall energy loss of the filter.

To somewhat reduce energy loss, certain MEMS devices, for example, certain FBAR RF filters, may be produced from high-resistance silicon instead of standard silicon. However, high-resistance silicon is significantly more expensive than conventional silicon.

BRIEF DESCRIPTION OF THE DRAWINGS

The subject matter regarded as the invention is particularly pointed out and distinctly claimed in the concluding portion of the specification. The invention, however, both as to organization and method of operation, together with features and advantages thereof, may best be understood by reference to the following detailed description when read with the accompanied drawings in which:

Figure 1:
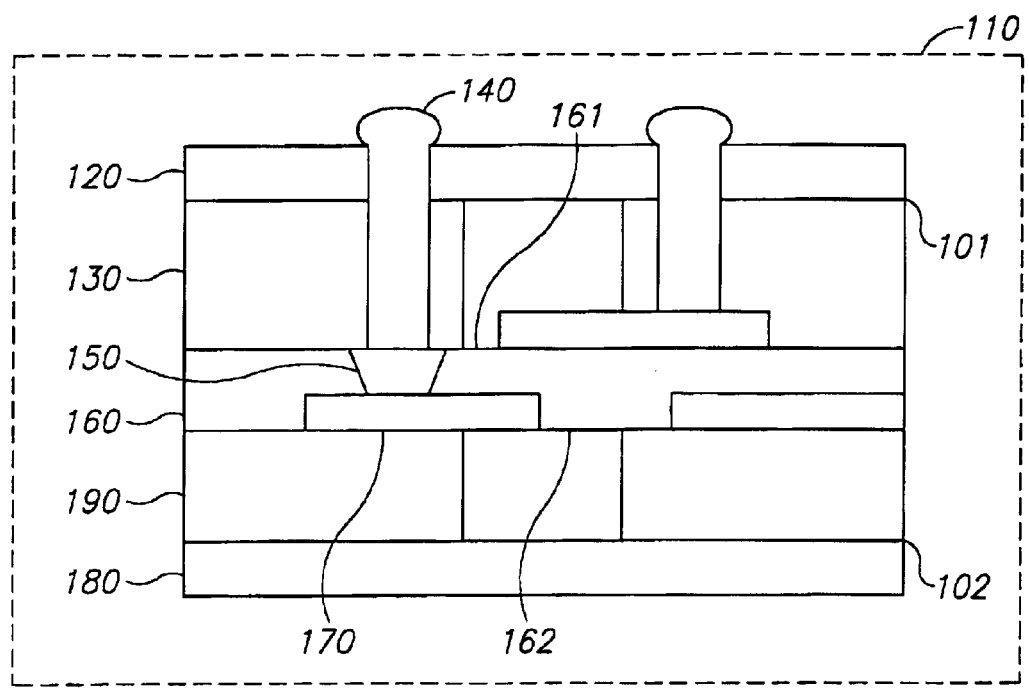
FIG. 1 is a schematic illustration of a reduced substrate MEMS device in accordance with exemplary embodiments of the present invention.

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

DETAILED DESCRIPTION OF THE INVENTION

Although the present invention is not limited in this regard, the term "MEMS device" as used herein may be understood to include, inter alia, any suitable Micro-Electro-Mechanical Systems device, for example, a Film Bulk Acoustic Resonator (FBAR) filter, a FBAR Radio Frequency (RF) filter, a RF switch, a varactor, a tunable capacitor, or any other MEMS device where it may be relevant to apply the principles of the present invention. Although an exemplary embodiment of the present invention may include a low-loss FBAR RF filter, it is presented herein only as an example of applying the principles of the present invention to a MEMS device; the present invention is not limited in this regard, and its principles may be applied to other suitable MEMS devices.

Furthermore, the term "support substrate" as used herein may be understood to include, inter alia, any suitable substrate, material, component, or layer, for example, silicon, which may be used to support a MEMS device and/or part of the MEMS device, for example, a membrane.

It will be appreciated that the terms "top" and "bottom" may be used herein for exemplary purposes only, to illustrate the relative positioning or placement of certain components, and/or to indicate a first and a second component. The terms "top" and "bottom" as used herein do not necessarily indicate that a "top" component is above a "bottom" component, as such directions and/or components may be flipped, rotated, moved in space, placed in a diagonal orientation or position, placed horizontally or vertically, or similarly modified.

In accordance with embodiments of the present invention, a Reduced Substrate MEMS Device (RSMD) may be produced. Benefits of using a RSMD in accordance with embodiments of the present invention may include, for example, reduction or elimination of the loss of energy to the support substrate, reduction in materials costs, and/or a reduction of the size, e.g., the thickness, of the device.

In accordance with exemplary embodiments of the present invention, a RSMD may include a MEMS device including a membrane having first and second sides; a first packaging part, attached to the first side of the membrane; and a second packaging part, attached to the second side of the membrane. In accordance with embodiments of the present invention, the RSMD may include substantially no support substrate, a trace of a support substrate, a relatively small amount or percentage of support substrate in comparison with conventional MEMS devices, a grinded and/or etched support substrate, and/or a reduced-thickness support substrate, or no support substrate.

FIG. 1 is a schematic illustration of a RSMD 110 in accordance with exemplary embodiments of the present invention, which may be used, for example, as a FBAR RF filter. In an embodiment of the present invention, RSMD 110 may include a top packaging part 101 and a bottom packaging part 102. Top packaging part 101 may include a top cap 120 and/or a top sealing ring 130. Bottom packaging part 102 may include a bottom cap 180 and/or a bottom sealing ring 190. In an embodiment of the present invention, RSMD 110 may further include a membrane 160 and/or conductors 170. Optionally, RSMD 110 may include contacts 140 and/or wafer vias 150.

It will be appreciated by persons skilled in the art that, in embodiments of the present invention, neither top packaging part 101 nor bottom packaging part 102 includes a support substrate, for example, silicon, which is present in conventional MEMS devices, e.g., the support substrate used during production of a conventional MEMS device.

Top cap 120 may be formed of insulating material, for example, a glass wafer. Although the present invention is not limited in this regard, in an exemplary embodiment of the present invention, the thickness of top cap 120 may be between 250 and 670 micrometers, for example, between 350 and 400 micrometers.

Top sealing ring 130 may be formed, for example, of a polymer or frit glass, and may be shaped and/or configured to fit RSMD 110 and its specific performance requirements. Although the present invention is not limited in this regard, in an exemplary embodiment of the present invention, the thickness of top sealing ring 130 may be between 100 and 500 micrometers. It should be noted that, in an exemplary embodiment of the present invention, one top sealing ring 130 may be sufficient to create a cavity suitable for efficient operation of RSMD 110, for example, a cavity able to accommodate sufficient freedom of movement (displacement amplitude) of membrane 160, e.g., along an axis perpendicular to membrane 160. Alternatively, more than one top sealing rings 130 may be used to obtain the desired cavity in RSMD 110.

Contacts 140 may be formed of any suitable conducting material, for example, a highly conductive metal, e.g., gold, or a gold alloy. Contacts 140 may be used, for example, to connect RSMD 110 with any external device and/or circuit (not shown), and/or to transfer signals out of and/or into RSMD 110. In an embodiment of the present invention, contacts 140 may be placed such that they are connected to conductors 170. Additionally or alternatively, contacts 140 may extend through top cap 120 and top sealing ring 130 using one or more wafer vias 150, which may include a conductive, e.g., metallic, via.

Membrane 160 may be formed of any suitable material, for example, Aluminum Nitride as used in FBAR devices, or any other suitable, e.g., piezoelectric, material. Although the present invention is not limited in this regard, in exemplary embodiments of the present invention membrane 160 may have a thickness of between 2 and 3 micrometers. Furthermore, in embodiments of the present invention, membrane 160 may be constructed in any suitable shape or form, and may include any suitable components, as may be required in accordance with specific implementations and/or designs. In an embodiment of the present invention, membrane 160 may have a side 161 and a side 162. In an embodiment of the present invention, side 161 of membrane 160 may be attached, e.g., bonded, to top packaging part 101, using any suitable attachment and/or bonding technique as known in the art. In an embodiment of the present invention, side 162 of membrane 160 may be attached, e.g., bonded, to bottom packaging part 102, using any suitable attachment and/or bonding technique as known in the art Conductors 170 may be formed of any suitable metal, for example, Aluminum. In an embodiment of the present invention, conductors 170 may be used, for example, to connect RSMD 110 to other components and/or circuits of a device and/or a system incorporating RSMD 110, using contacts 140 and/or other conducting elements (not shown).

Bottom cap 180 may be formed of insulating material, for example, a glass wafer. Although the present invention is not limited in this regard, in an exemplary embodiment of the present invention, the thickness of bottom cap 180 may be between 250 and 670 micrometers, for example, between 350 and 400 micrometers. It is noted that, in embodiments of the present invention, bottom cap 180 and top cap 120 may both be formed of the same material, or each of caps 180 and 120 may be formed of a different material. Similarly, in embodiments of the present invention, caps 180 and 120 may have substantially the same thickness, or each of caps 180 and 120 may have a different thickness.

Bottom sealing ring 190 may be formed, for example, of a polymer or frit glass material, and may be shaped and/or configured to fit RSMD 110 and its specific performance requirements. Although the present invention is not limited in this regard, in an exemplary embodiment of the present invention, the thickness of bottom sealing ring 190 may be between 100 and 500 micrometers. As explained above with reference to sealing ring 130, in an exemplary embodiment of the present invention, one bottom sealing ring 190 may be sufficient to create the cavity suitable for efficient operation of RSMD 110, for example, to accommodate sufficient freedom of movement (displacement amplitude) of membrane 160. Alternatively, more than one bottom sealing rings 190 may be included in RSMD 110 to provide the desired cavity.

In an exemplary embodiment of the present invention, top packaging part 101 and/or bottom packaging part 102 may be placed, positioned and/or aligned such that membrane 160 is "sandwiched" between top packaging part 101 and bottom packaging part 102, and/or such that membrane 160 may be free to resonate and/or move in directions transverse to the plane of membrane 160.

It will be appreciated by persons skilled in the art that, although the above description and/or the schematic illustration in FIG. 1 may depict a generally planar MEMS device, and/or packaging parts and/or components placed generally parallel to each other, the present invention is not limited in this regard. Embodiments of the present invention may include MEMS devices that are not planar, and/or components and/or packaging parts that are not parallel or generally parallel to each other.

Figure 2A:
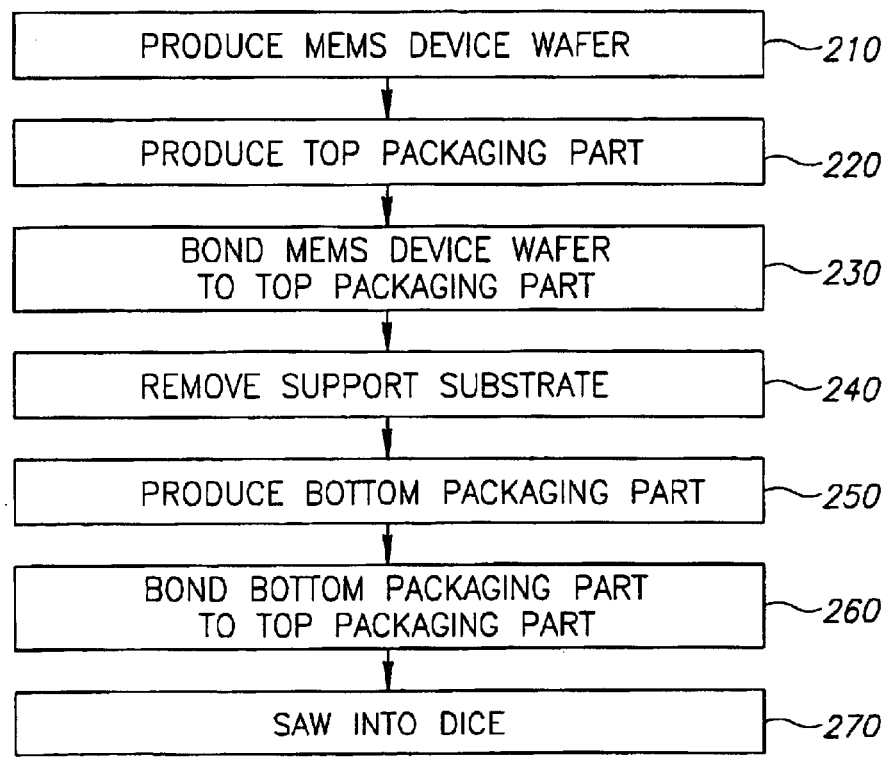
FIG. 2A is a schematic flowchart depicting a process for producing a reduced substrate MEMS device in accordance with exemplary embodiments of the present invention.
Figure 2B:
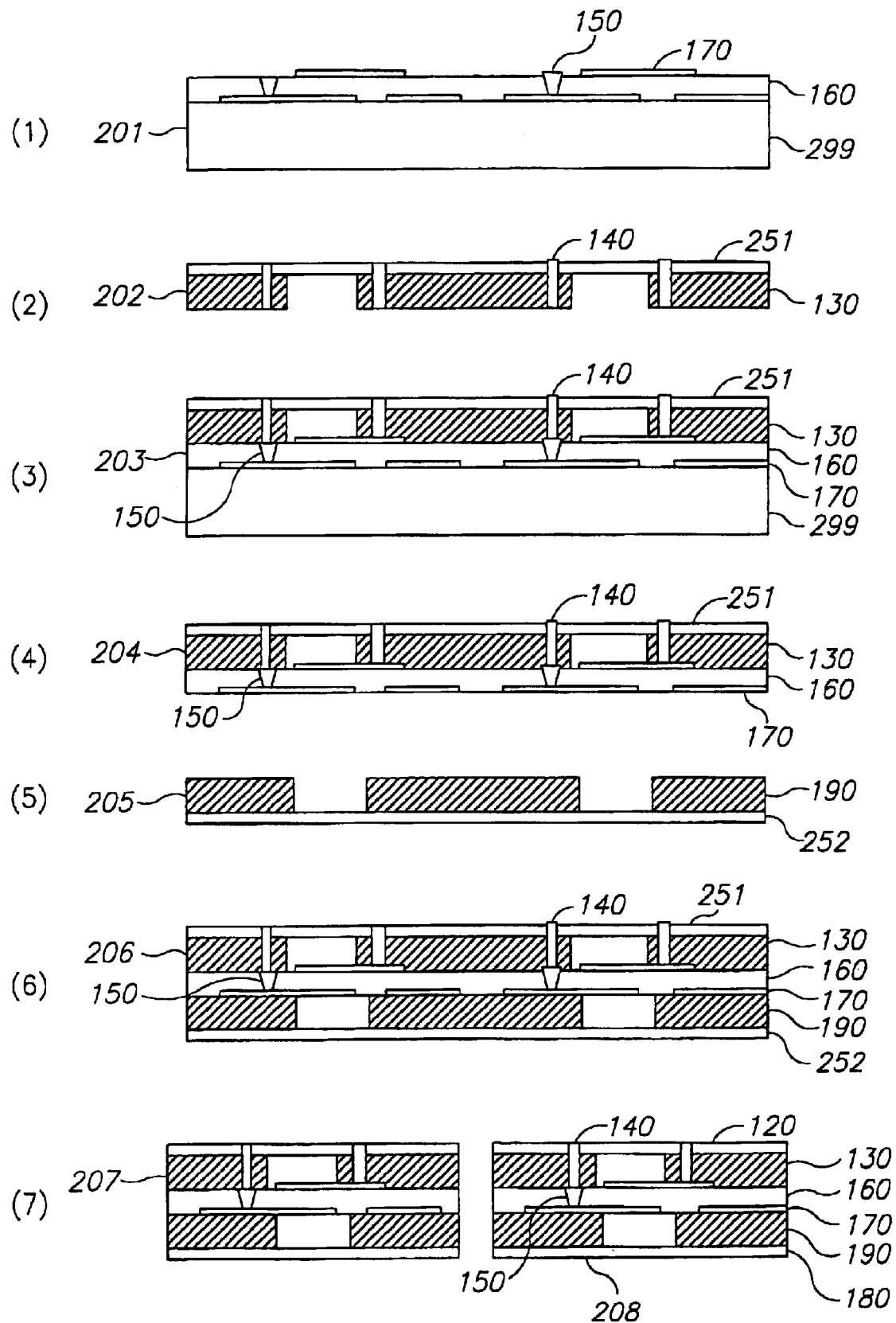
FIG. 2B is a schematic illustration of exemplary stages in the process of FIG. 2A, showing exemplary components useful in understanding the process.

Reference is now made also to FIGS. 2A and 2B. FIG. 2A is a schematic flowchart depicting a process for producing a RSMD, for example, RSMD 110, in accordance with exemplary embodiments of the present invention. FIG. 2B is a schematic illustration of exemplary stages in the process of FIG. 2A, showing exemplary components useful in understanding the process.

Although the present invention is not limited in this regard, the term "producing" as used herein with reference to an item, may be understood to include, inter alia, manufacturing or assembling the item, providing a pre-fabricated item, or processing a partly formed item.

As indicated at block 210 of FIG. 2A, the process may begin by producing a MEMS device wafer 201. In an embodiment of the present invention, MEMS device wafer 201 may include a wafer accommodating one or more MEMS devices or a plurality of MEMS devices. As indicated at stage (1) of FIG. 2B, MEMS device wafer 201 may include a substrate 299, for example, a relatively thick silicon substrate, as well as conductors 170, membrane 160, and wafer vias 150.

As indicated at block 220 in FIG. 2A, the process may continue with producing a top packaging part 202, which may include a top cap wafer 251 and/or top sealing rings 130. As indicated at stage (2) of FIG. 2B, top packaging part 202, which is a resulting part of the above operations, may include top cap wafer 251, top sealing rings 130, and optional contacts 140.

As indicated at block 230 in FIG. 2A, the process may continue with bonding MEMS device wafer 201 to top packaging part 202. The bonding may be performed in any suitable way, for example, using epoxy glue or frit glass bonding. As indicated at stage (3) of FIG. 2B, a resulting part 203 of the above operations may include top cap wafer 251, top sealing rings 130, contacts 140, wafer vias 150, membrane 160, conductors 170, and substrate 299.

In accordance with embodiments of the invention, as indicated at block 240 in FIG. 2A, the process may continue with removing substrate 299. In an exemplary embodiment of the present invention, substrate 299 may be etched and/or grinded, partly or entirely. Although the present invention is not limited in this regard, etching and/or grinding substrate 299 may include, for example, a rough removal of substrate 299 by grinding, and/or a fine removal of substrate 299 by etching. Additionally or alternatively, etching in accordance with embodiments of the present invention may be performed using dry etching, for example, plasma enhanced etching using a suitable gas, e.g., Sulfur Hexafluorid (SF6). As indicated at stage (4) of FIG. 2B, a resulting part 204 of the substrate removal described above may include membrane 160, top cap wafer 251, top sealing rings 130, conductors 170, contacts 140, and wafer vias 150.

As indicated at block 250 in FIG. 2A, the process may continue with producing a bottom packaging part 205, which may include a bottom cap wafer 252 and/or bottom sealing rings 190. In contrast to top cap wafer 251, in an exemplary embodiment of the present invention, it may not be required to insert and/or place contacts through bottom cap wafer 252, although such a design may be optionally used according to specific requirements. As indicated at stage (5) of FIG. 2B, in an embodiment of the present invention, second packaging part 205, which is a resulting part of the above operations, may include bottom cap wafer 252 and bottom sealing rings 190.

As indicated at block 260 in FIG. 2A, bottom packaging part 205 may be bonded to top packaging part 202. The bonding may be performed in any suitable way, for example, using epoxy glue or frit glass bonding. The bonding may include, for example, aligning top packaging part 202 and bottom packaging part 205 such that membrane 160 may be "sandwiched" between them. In an embodiment of the present invention, membrane 160 may be free to move and/or resonate in directions transverse to the plane of membrane 160. As indicated at stage (6) of FIG. 2B, a resulting part 206 of the above operations may include top cap wafer 251, top sealing rings 130, contacts 140, wafer vias 150, membrane 160, conductors 170, bottom sealing rings 190, and bottom cap wafer 252.

As indicated at block 270 in FIG. 2A, the bonded wafers may be sawed into a plurality of separate dice, using a suitable dicing method, e.g., as is known in the art. In an exemplary embodiment of the present invention, the dicing may result in separation of a processed wafer into two or more RSMDs, for example, RSMDs 207 and 208, as indicated at stage (7) in FIG. 2B. For example, the resulting RSMD 208 may include top cap 120, top sealing ring 130, contacts 140, wafer vias 150, membrane 160, conductors 170, bottom sealing ring 190, and bottom cap 180.

In exemplary embodiments of the present invention, the process of FIG. 2A may be implemented in a different order of operations, for example, top packaging part 202 may be produced and/or bonded after the production and/or bonding of bottom packaging part 205, or vice versa. It will be appreciated by persons skilled in the art that other processes may be used to produce one or more RSMDs in accordance with embodiments of the present invention.

Figure 3:
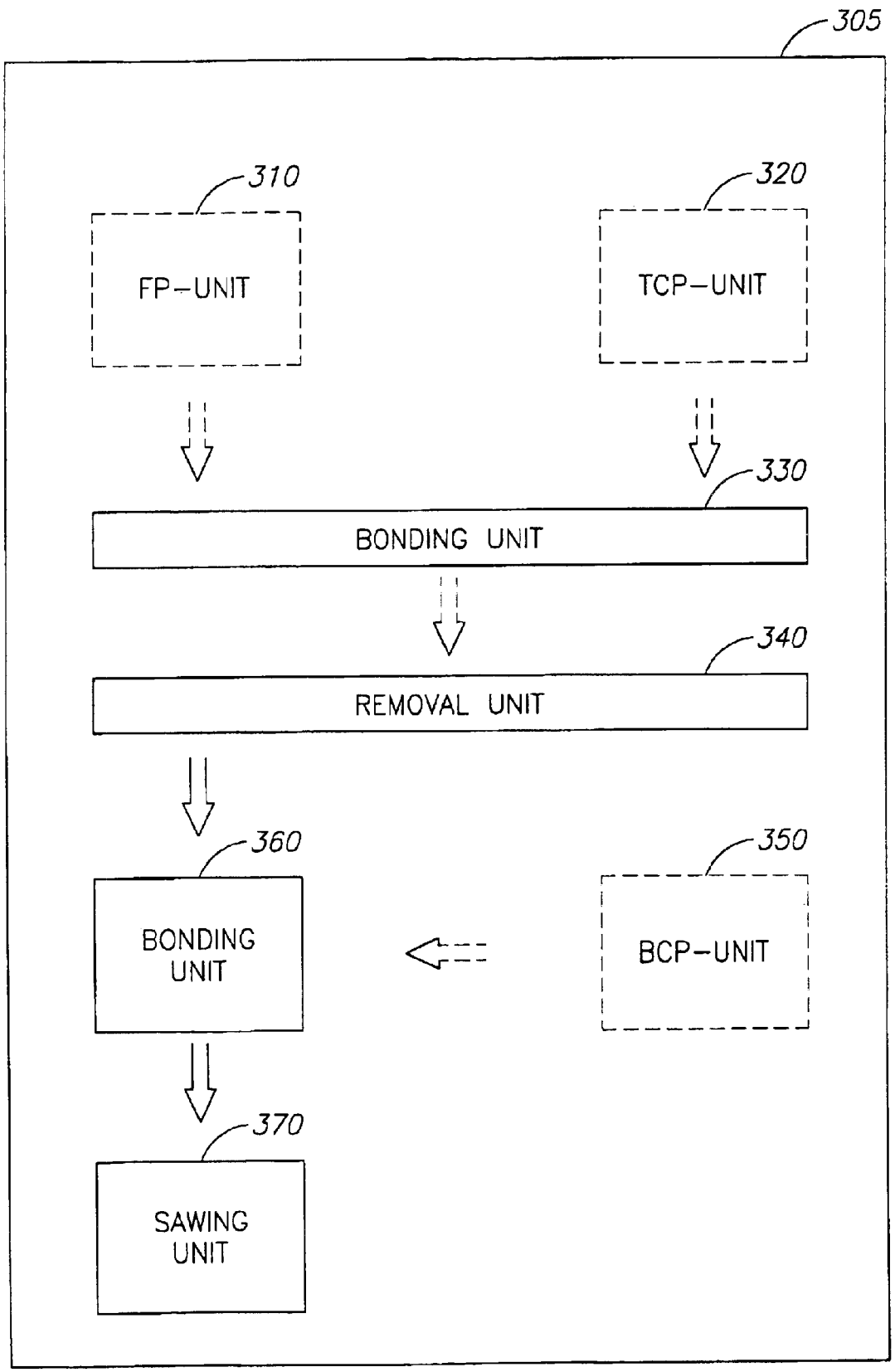
FIG. 3 is a schematic illustration of a system to produce a reduced substrate MEMS device in accordance with exemplary embodiments of the present invention.

Reference is now made to FIG. 3, which is a schematic illustration of a system 305 to produce one or more RSMDs, for example, RSMD 110, in accordance with exemplary embodiments of the present invention. System 305 may include, for example, a removal unit 340, bonding units 330 and 360, and a sawing unit 370. Furthermore, system 305 may optionally include a Filter Production Unit (FP-unit) 310, a Top Cap Production Unit (TCP-unit) 320, and/or a Bottom Cap Production Unit (BCP-unit) 350. Although the present invention is not limited in this regard, system 305 may be used, for example, to execute a production process as described in detail above with reference to FIG. 2A, or any other suitable production process in accordance with embodiments of the present invention.

Removal unit 340 may include a unit to remove substrate from a MEMS device, for example, by grinding and/or etching the substrate, as described in detail above with reference to block 240 of FIG. 2A. Sawing unit 370 may include, for example, a unit to saw bonded wafers into separate dice and/or filters, as described in detail above with reference to block 270 of FIG. 2A.

Bonding unit 330 may include, for example, a unit to bond a MEMS device wafer to top packaging part 202, as described in detail above with reference to block 230 of FIG. 2A. Bonding unit 360 may include, for example, a unit to bond top packaging part 202 to bottom packaging part 205, as described in detail above with reference to block 260 of FIG. 2A FP-unit 310 may include, for example, a unit to produce a MEMS device wafer 201, as described in detail above with reference to block 210 of FIG. 2A. TCP-unit 320 may include, for example, a unit to produce top cap wafer 251, as described in detail above with reference to block 220 of FIG. 2A. BCP-unit 350 may include, for example, a unit to produce bottom cap wafer 252, as described in detail above with reference to block 250 of FIG. 2A.

It is noted that embodiments of the present invention may include units and/or sub-units, which may be separate of each other or combined together, and may be implemented using specific, multi-purpose or general devices as known in the art.

While certain features of the invention have been illustrated and described herein, many modifications, substitutions, changes, and equivalents may occur to those of ordinary skill in the art. It is, therefore, to be understood that the appended claims are intended to cover all such modifications and changes as fall within the true spirit of the invention.

What is claimed is:

1. An apparatus comprising:
   a Micro-Electro-Mechanical Systems (MEMS) device including:
   a membrane having first and second sides;
   a first packaging part attached to the first side of said membrane; and
   a second packaging part attached to the second side of said membrane,
   wherein said membrane is able to move within a cavity defined at least partly in at least one of said first and second packaging parts,
   and wherein none of said first and second packaging parts and said membrane comprises a substantial amount of support substrate.

2. The device of claim 1, wherein the first packaging part comprises a cap and a sealing member.

3. The device of claim 2, wherein the second packaging part comprises a cap and a sealing member.

4. The device of claim 1, further comprising a conductor associated with said membrane.

5. The device of claim 1, wherein said device comprises a Film Bulk Acoustic Resonator filter.

6. The device of claim 1, wherein said device comprises a Film Bulk Acoustic Resonator Radio Frequency filter.

7. The device of claim 1, wherein none of said first and second packaging parts and said membrane comprises a substantial amount of silicon.

8. The device of claim 1, wherein the membrane comprises piezoelectric material.

9. The device of claim 1, wherein the membrane comprises Aluminum Nitride.

10. The device of claim 1, wherein the first packaging part comprises insulating material.

11. The device of claim 10, wherein the second packaging part comprises insulating material.

12. The device of claim 1, wherein the first packaging part comprises glass.

13. The device of claim 12, wherein the second packaging part comprises glass.

14. An apparatus comprising:
   a Micro-Electro-Mechanical Systems (MEMS) device including:
   a first packaging part;
   a second packaging part; and
   a support-substrate-removed membrane having first and second sides and positioned between said first and second packaging parts such that said first side is attached directly to said first packaging part and said second side is attached directly to said second packaging part, said membrane able to move within a cavity defined at least partly in at least one of said first and second packaging parts.

15. The device of claim 14, wherein the membrane comprises piezoelectric material.

16. The device of claim 14, wherein the membrane comprises Aluminum Nitride.

17. The device of claim 14, wherein the first packaging part comprises insulating material.

18. The device of claim 17, wherein the second packaging comprises glass.

19. The device of claim 14, wherein the first packaging part comprises glass.

20. The device of claim 19, wherein the second packaging part comprises glass.

21. The device of claim 14, wherein said device comprises a Film Bulk Acoustic Resonator filter.

* * * * *

UNITED STATES PATENT AND TRADEMARK OFFICE
CERTIFICATE OF CORRECTION

PATENT NO. : 6,894,383 B2
DATED : May 17, 2005
INVENTOR(S) : Bar-Sadeh, Eyal

It is certified that error appears in the above-identified patent and that said Letters Patent is hereby corrected as shown below:

Title page,
Item [75], Inventors, please replace "Alexander Talalyevsky" with -- Alexander Talalaevski --.

Signed and Sealed this

Eighth Day of November, 2005

JON W. DUDAS
*Director of the United States Patent and Trademark Office*